US008861567B2

United States Patent
Li et al.

(10) Patent No.: US 8,861,567 B2
(45) Date of Patent: Oct. 14, 2014

(54) METHOD AND APPARATUS FOR ANALYZING THE SPECTRUM OF RADIO-FREQUENCY SIGNALS USING A FIBER OPTIC RECIRCULATION LOOP

(71) Applicant: U.S. Army Research Laboratory, Adelphi, MD (US)

(72) Inventors: Ming-Chiang Li, Mitchellville, MD (US); Weimin Zhou, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 85 days.

(21) Appl. No.: 13/677,659

(22) Filed: Nov. 15, 2012

(65) Prior Publication Data

US 2014/0133521 A1     May 15, 2014

(51) Int. Cl.
    *H04B 1/00*            (2006.01)
    *H04B 10/00*          (2013.01)
    *H04B 1/7156*        (2011.01)

(52) U.S. Cl.
    CPC ........................... *H04B 1/7156* (2013.01)
    USPC .......................................... 375/136; 398/115

(58) Field of Classification Search
    USPC ............. 375/136, 224, 228, 316; 398/74, 82, 398/115–116
    See application file for complete search history.

(56) References Cited

U.S. PATENT DOCUMENTS

2013/0209107 A1*   8/2013   Stead et al. .................... 398/116
2013/0315590 A1*   11/2013   Zhou ................................ 398/48

* cited by examiner

*Primary Examiner* — Khanh C Tran
(74) *Attorney, Agent, or Firm* — Alan I. Kalb

(57) ABSTRACT

An apparatus comprising a fiber optical loop for conducting a first and a second pulse having a corresponding first and second wavelength, a first splitter for separating the first and second light pulses in the optical loop into a first and second light path to introduce a predetermined time delay between the first and second light pulses, a coupler for tapping a replica of the pair of light pulses from the loop, an auto-correlation module, coupled to the coupler, for correlating the replica of the pair of light pulses with each other to produce a set of data points comprising a plurality of multiplied and correlated pair of pulses and a transform module, coupled to the auto-correlation module, for transforming the data points into a channelized frequency spectrum.

20 Claims, 2 Drawing Sheets

METHOD AND APPARATUS FOR ANALYZING THE SPECTRUM OF RADIO-FREQUENCY SIGNALS USING A FIBER OPTIC RECIRCULATION LOOP

GOVERNMENT INTEREST

Governmental Interest—The invention described herein may be manufactured, used and licensed by or for the U.S. Government.

FIELD OF INVENTION

Embodiments of the present invention generally relate to radio-frequency communications and, more particularly, to a method and apparatus for analyzing the spectrum of radio-frequency signals using a fiber optic recirculation loop.

BACKGROUND OF THE INVENTION

Typically, public radio-frequency (RF) communications are transmitted at a preconfigured frequency so that a receiver can tune to the particular frequency and receive the communications. In contrast, private communications are transmitted across multiple frequencies (e.g., using frequency hopping and/or spread spectrum techniques). In some instances, these private communications need to be captured by unintended receivers, e.g., law enforcement agencies, military organizations and the like. However, difficulties arise when a communication is transmitted across various frequencies, i.e., frequency hopping is employed, in the form of short RF pulses where each broadcast is on a different frequency.

Without knowing the frequency hopping pattern, a receiver must attempt to capture all signals in the relevant band. Typically, all the signals within the band are digitized and then processed using a very high speed digital signal processing (DSP) system. Such high speed DSP systems are very costly to manufacture, operate and maintain. In some instances, the band of interest is divided into sub-bands and each sub-band is digitized and processed in a corresponding DSP. Such sub-band channelization enables many signals to be quickly processed in parallel using less expensive DSP circuits (i.e., lower speed circuits). However, even a channelized, broad band receiver is very expensive to manufacture, operate and maintain.

Recently, optical systems have found use in broad band signal processing wherein the received RF signals are used to modulate a light signal and the light signal is processed using optical signal processing. Such techniques, unfortunately, are prone to noise and system instability.

Therefore, there is a need in the art for an improved a method and apparatus for analyzing the spectrum of radio-frequency signals using a fiber optic recirculation loop.

BRIEF SUMMARY OF THE INVENTION

Embodiments of the present invention relate to an apparatus comprising a fiber optical loop for conducting a first and second light, generated by a first and second light source, modulated by a radio frequency signal by a modulator to create a first and second pulse with corresponding first and second wavelengths, a first splitter for separating the first and second pulses in the optical loop into a first and second path for a small portion of the loop to introduce a predetermined time delay between the first and second pulse, a coupler for tapping a replica of the pair of pulses from the loop and an auto-correlation module, coupled to the coupler, for correlating the replica of the pair of pulses with each other.

Another embodiment of the present invention is directed to a method determining a channelized frequency spectrum from an RF signal comprising conducting, in a fiber optical loop, a first and second light generated by a first and second light source, modulating, using a modulator, the first and second light by a radio frequency signal to create a first and second pulse with corresponding first and second wavelengths, splitting, using a first splitter, the first and second pulses in the optical loop into a first and second path for a small portion of the loop to introduce a predetermined time delay between the first and second pulse, tapping, using a coupler, a replica of the pair of pulses from the loop, correlating, using an auto-correlation module, coupled to the coupler, the replica of the pair of pulses with each other and performing a Fast-Fourier Transform (FFT), using an FFT module, on a plurality of the correlated pair of pulses, generating a channelized frequency spectrum.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention comprise a method and apparatus detecting radio-frequency signals using a fiber optic recirculation loop, by modulating an input RF signal using two lasers of differing wavelength, and introducing a time delay between the lasers to auto-correlate the two time-delayed lasers. Light from the first and second laser with differing wavelengths are modulated using the received RF input signal, which is comprised of multiple frequencies. The modulated lights are converted into a pair of pulses of light. The pulse circulates through the optical loop a finite number of times. A split path in the loop with a time adjuster allows for introducing a customizable delay between each pulse of light, irrespective of the natural delay caused by the difference of travel time due to the difference of wavelength in the pair of pulses. For every cycle the pulses take through the fiber, a replica pulse pair is "tapped" from the loop. The tapped pulse pair is photo-detected to create two RF signals; the two RF signals are correlated with each other within an RF mixer, filtered, and then digitized. Once the loop has run multiple times, a Fast Fourier transform (FFT) is performed on the accumulated digitized signals (data points) to generate a channelized frequency spectrum representing information carried by the received RF signals.

Figure 1:
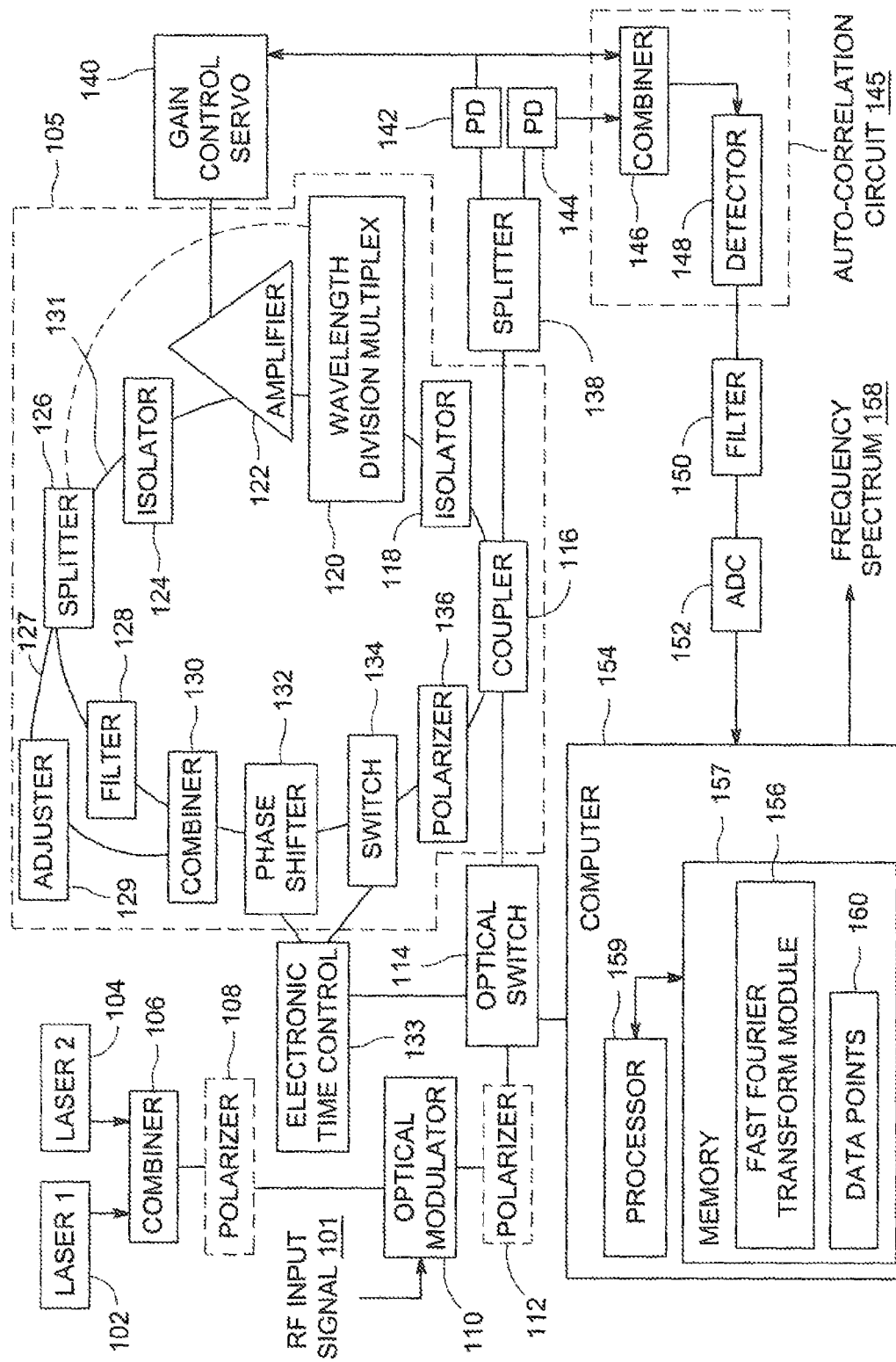
FIG. 1 is a block diagram of an apparatus for detecting radio-frequency signals using a fiber optic recirculation loop.

FIG. 1 is a block diagram of an apparatus 100 for detecting radio-frequency signals using a fiber optic recirculation loop. The apparatus 100 comprises a first laser 102, a second laser 104, a combiner 106, a first polarizer 108, an optical modulator 110, a second polarizer 112, an optical switch 114, an electronic time control 133, a 2-by-2 coupler 116, a first isolator 118, a wavelength division multiplex (WDM) 120, an amplifier 122, a second isolator 124, a splitter 126, a filter 128, a second combiner 130, an optional phase shifter 132, an electronic time control 133, a switch 134, a second polarizer 136, a second splitter 138, a first photodetector 142, a second photodetector 144, a second combiner 146 and a square-law RF detector 148 which form a an auto-correlation circuit (e.g., an RF electronic multiplexer) 145, a second filter 150, an analog to digital converter (ADC), and a computer 154. The computer 154 comprises a processor 159 and memory 157. The memory 157 comprises an Fast-Fourier transform module 156 and stores data points 160.

According to an exemplary embodiment of the present invention, the apparatus 100 processes an RF input signal 101 and produces frequency spectrum 156 representing information carried by the RF input signal 101. The RF input signal 101 is an RF signal and the first and second laser 102 and 104 are carrier wave light signals.

The RF input signal 101 may be received via a conventional RF front end (not shown) comprising, for example, an antenna, low noise amplifier and various filters. The choice of components and arrangement depends upon the nature of the signals that are to be processed. The selection of components and their arrangement is a design choice capable of being made by anyone with skill in the RF communication arts.

The lasers 102 and 104 provide laser light of wavelength $\lambda_1$ and $\lambda_2$, respectively. The combiner 106 combines the laser lights from lasers 102 and 104. According to an exemplary embodiment, the combiner 106 is a wavelength division multiplex (WDM) and the frequency difference between $\lambda_1$ and $\lambda_2$ is much larger than the RF microwave operation frequencies and bandwidth. In some embodiments, the laser light from lasers 102 and 104 is infrared light and the difference in wavelength $\lambda_1$ and $\lambda_2$ is approximately 100 GHz. The combined light output from the combiner 106 is optionally coupled to a polarizer 108 to polarize the light. According to an exemplary embodiment, the polarizer 108 is a fiber polarizer. The combiner 106 (or optionally the polarizer 108) transmits the combined light to the optical modulator 110 to modulate the laser lights by the input RF signal. The polarizer 108 may be located before the optical modulator 110 or before the optical modulator 110 according to various embodiments of the present invention.

The optical modulator 110 modulates light from the laser 102 and 104 with the RF input signal 101, creating an RF modulated light wave. According to an exemplary embodiment, the lasers 102 and 104 are continuous wave lasers. Also according to an exemplary embodiment of the present invention, the optical modulator 110 is a Mach Zehnder modulator. The optical switch 114 (e.g., an optical gate switch) converts the modulated light into a pair of RF modulated optical pulse. Optionally, the switch 114 is a 1×2 switch in which the first output carries the pulses to a 2×2 optical coupler 116. The second output of the switch 114 can be used to connect to another optical switch for time division multiplex cascading to additional recirculation loops to process any signals received within a large time window such as continuous wave (CW) signals as opposed to pulsed RF signals.

Once the switch 114 generates the optical pulses, the pulses enter the coupler 116. According to an exemplary embodiment, the coupler has a coupling ratio range from 50%:50% to 1%:99%. Once the pulses enters the switch 114, the switch 114 closes so further pulses cannot enter the loop 105 causing distortion and noise.

The optical recirculation loop 105 is formed by connecting one output of the coupler 116, which according to an exemplary embodiment is a 2×2 coupler, to the second input of the same coupler with several optical components in the loop. According to exemplary embodiments of the present invention, the loop length generally does not affect the ability to tap out replica pulse pairs, however loops with length less than one pulse width will cause overlap and distort results. The loop 105 may be a dispersion shifted fiber where there is non-dispersion around the operating wavelength of the lights.

The optical loop contains an isolator 118 which isolates the pulses. An optional WDM 120 combines a third wavelength by forming a third loop between the WDM splitter 126 and 120. The amplifier 122 amplifies the isolated pulse pairs from isolator 118. Optionally, isolator 124 is placed in the loop after the amplifier 122 to allow a continuous wavelength (CW) light with the third wavelength be amplified so to keep the amplifier working in a steady state instead an unstable state when there are only short pulse to be amplified. This will further reduce any noise in the pulse pairs. According to an exemplary embodiment of the present invention, the optical amplifier 122 is an Erbium doped fiber amplifier (EDFA), though the present invention does not limit the type of optical amplifier used.

The optical amplifier 122 amplifies the pulses to compensate for the coupling loss. The isolator 118 is coupled to the loop 105 to prevent any light going in the reverse direction from causing interference in the loop 105. The pulse pairs are then transmitted to a splitter 126. According to an exemplary embodiment, the splitter 126 is a WDM splitter which routes the pulse pairs into a first path 127 and a second path 131 according to their wavelength $\lambda 1$ and $\lambda 2$ to introduce a pre-configured delay between the transmission of the first and second pulse. This allows for auto-correlation of the two pulses later on.

According to one embodiment of the present invention, the EDFA 122 can be replaced by two EDFAs placing in each path 127 and 131. According to an alternate embodiment, there is a gain control attenuators in each path 127 and 131 in place of the two EDFAs to balance the intensity/power of the first and second modulated signal. The WDM splitter 126 is, according to an exemplary embodiment, implemented a two wavelength filters which filter for optical noise produced by the amplifier 122.

Filter 128 is an optional filter for removing any further noise in the pulse traversing the first path 127. The adjuster 120 is an optical path length adjuster for adjusting relative travelling time between the two differing wavelength pulses, i.e., the path length adjuster will increase or decrease the time it takes for a pulse travelling the first path 127 to travel through the path 127. A combiner 130 combines the two pulses and couples the pulses to a switch 134, which according to an exemplary embodiment is a high speed optical switch used as a time domain filter to filter out light noise outside of the switching window. The phase shifter 132 is optionally added before the switch 134 to introduce a random phase shift to prevent the residue CW light noise because resonant noise (lasing). The output of switch 134 is connected to a polarizer 136 for reducing polarization dependent effects inherent in the fiber of the loop to change the coupling ratio for the coupler 116 and then back to an input of the coupler 116 to close the loop 105.

The electronic time control circuit 133 controls the functionality of the switch 134, by synchronizing with control of the switch 114. The coupler 116 outputs a replica pulse pair at its second output after each loop cycle. The splitter 138 (e.g., a WDM splitter) splits the replicated pulse pairs into individual pulses. The photodetectors 142 and 144 each convert the RF modulated optical pulses into RF modulated electronic pulse signals.

For n passes through the loop 105, the nth pulse pair replica will have a time delay of nΔt between the two pulses due to the first path 127 having the adjuster 129 for adjusting travel time of one of the pulses, where Δt=ΔL/c. ΔL is the effective optical path difference of the two pulse wavelengths in one loop cycle. The wavelengths of the lasers 102 and 104 are customizable. Optionally, an RF phase shifter is connected to the output of the photodetector 142 to set an initial phase adjustment, for example, φ, between the two pulses of each pair.

If a single RF frequency ω signal is introduced at the input, for the $n^{th}$ pulse pair, the two pulse signals are represented as A cos(ωt$_n$) and B cos(ω(t$_n$+nΔt)+φ], where A and B are the pulse signal amplitudes, and t$_n$ is the time that has passed as of the $n^{th}$ loop cycle. In an exemplary embodiment, a negative feedback control is provided for a servo 140 from the combiner 146 to control the gain of the amplifier 122 in the loop 105, preventing over and under amplification and compensating for drift in the loop 105.

The output RF electronic pulse signals from the photodetectors 142 and 144 are coupled to a RF electronic multiplexer circuit 145 to multiply the pulse pairs together. This is also known as an auto-correlation module. The multiplexer 145 integrates many pulses over time. The pulse pairs are auto-correlated to help in finding the presence of repeating patterns and periodic signals in the RF input 101. According to an exemplary embodiment, the circuit 145 comprises a 2×1 RF combiner 146 connected to a square-law RF detector 148 to produce the multiplication product for the correlation process.

In an exemplary embodiment, the detector 148 is a square law RF detector such as a crystal detector (Low Barrier Schottky diode) or an RF mixer. The output of the multiplexer 145 is coupled to an optional RF filter 150 which filters the high band frequencies, i.e., a low pass filter, yielding just a baseband signal cos(ωnΔt+φ) and a DC signal. A DC block may optionally be used to filter out the DC signal. The baseband signal is coupled to an ADC 152 such that each replicated pulse pair yields a data point for autocorrelation with a different delay between the pulse pair.

These points are stored in memory 157 as data points 160. The computer 154 (e.g., a fully programmable gate array, or the like) contains a Fast Fourier transform (FFT) module 156 in its memory 157 which performs a Fourier transformation to transform the series of pulse pairs from time domain to frequency domain, thereby obtaining the RF spectrum of the input RF pulse 101. In an exemplary embodiment, the memory 157 may include one or more of the following: random access memory, read only memory, magneto-resistive read/write memory, optical read/write memory, cache memory, magnetic read/write memory, and the like, as well as signal-bearing media, not including non-transitory signals such as carrier waves and the like.

The FFT module 156 performs an FFT on the data points from the ADC 152 to generate a channelized frequency spectrum. The FFT module 156 converts the data points from the time domain to the frequency-squared domain, from which the frequency spectrum data 1158 is obtained using signal processing techniques known to those of ordinary skill in the art.

According to other exemplary embodiments of the present invention, an optical path length random perturbation device 132 such as an optical phase shifter or fiber stretcher is inserted in the loop 105 to reduce the resonance effect on the noise signal in the loop. An optional ring laser loop is added in the loop 105 to stabilize the optical amplifier 122 by allowing a third wavelength be constantly amplified by the EDFA and cause lasing in continuous wave (CW) mode. In other embodiments, laser 102 and laser 104 are replaced with laser transmitters with wavelength λ1 and λ2. The RF input signal 101 is split and used to modulate the two laser transmitters.

According to other exemplary embodiments of the present invention, photodetectors 142 and 144, the splitter 138 and the combiner 146 are replaced by one photodetector and an amplifier combination at the output of lop 105 at the 2×2 coupler 116. According to this embodiment, optical pulse monitoring by the gain control serve 140 must be tapped from inside the loop as opposed to from the combiner 146.

Figure 2:
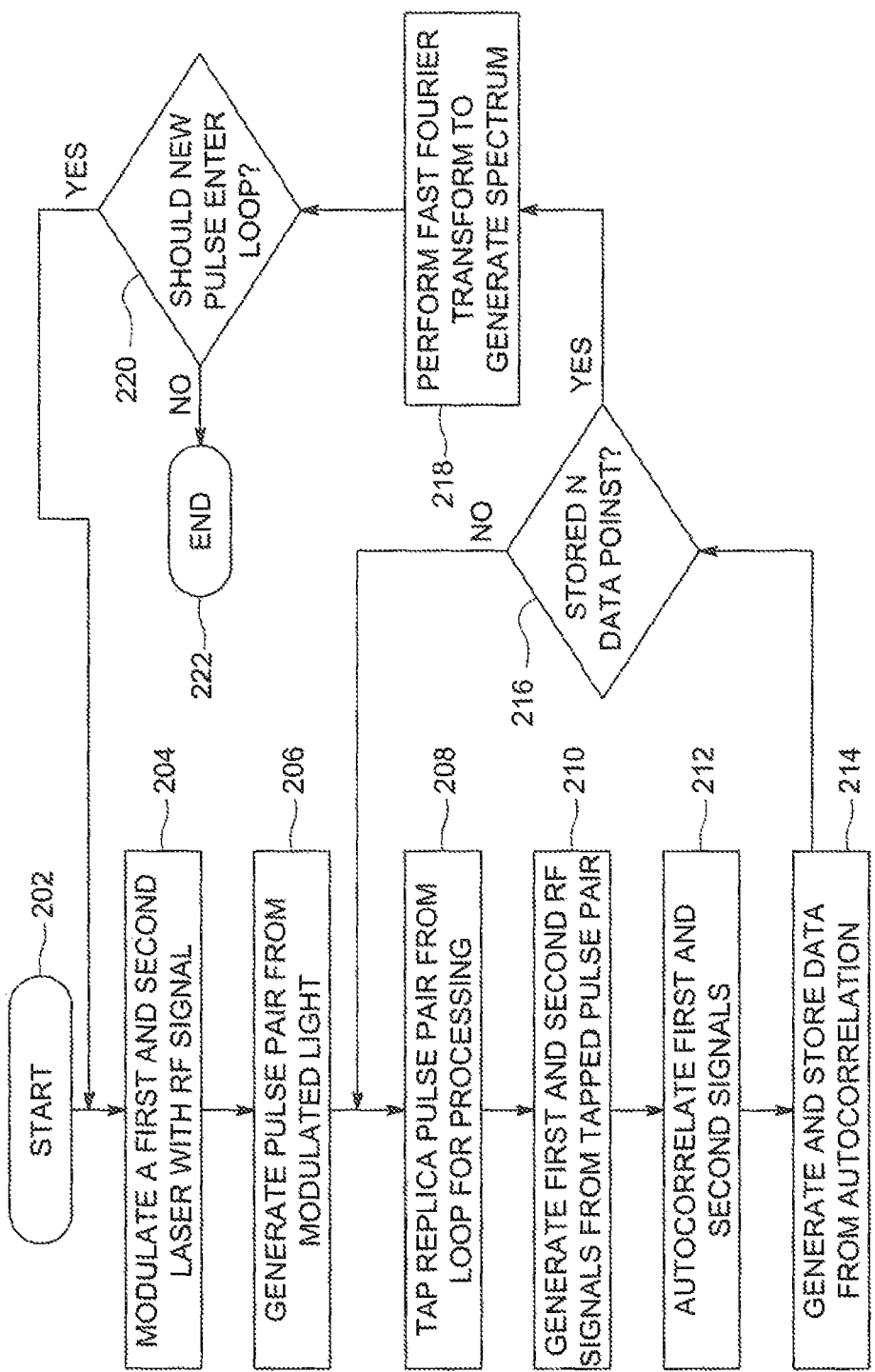
FIG. 2 is a flow diagram of method for detecting radio-frequency signals using an optical loop.

FIG. 2 is a flow diagram of method 200 for detecting radio-frequency signals using an optical loop. The method begins at step 202 and proceeds to step 204, where a first and second light from a laser is modulated by an RF input signal using RF modulator 110. At step 206, the switch 108 generates a pair of pulses of the modulated optical signal with a first and second wavelength based on the wavelength of the first and second light. At step 208, a replica of the pulse is tapped from the loop 105 for processing, while the remaining portion of the pulse re-circulates in the loop 105.

At step 210, first and second RF signals are generated from the pulse pair and then auto-correlated at step 212. The two RF signals have a time delay between them due to the first path having an adjuster 129 embedded in it, for reducing or increasing the time a pulse takes to travel the first path 127. At step 214, data points are generated by the ADC 108 to digitize the auto-correlation and the digitized data points are stored in memory 132. At step 216, the method determines whether N points have been stored.

If N points have not been stored, the method returns to step 208 to tap more pulses from the loop 109. If N points have been stored, the FFT module 134 performs a FFT on the N points to generate a frequency domain spectrum at step 218. At step 220, it is determined whether a new pulse should enter the loop. If so, the method proceeds to step 204 of modulating light from a laser with an RF input. If there are no more pulses, the method ends at step 222. According to an exemplary embodiments, N=500, 1000 or the like.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Various elements, devices, modules and circuits are described above in associated with their respective functions. These elements, devices, modules and circuits are considered means for performing their respective functions as described herein. While the foregoing is directed to embodiments of the present invention, other and further embodiments of the invention may be devised without departing from the basic scope thereof, and the scope thereof is determined by the claims that follow.

The invention claimed is:

1. An apparatus comprising:
   as fiber optical loop for conducting a first and a second light pulses having a corresponding first and second wavelengths;

a first splitter for separating the first and second light pulses in the optical loop into a first and second light paths to introduce a predetermined time delay between the first and second light pulses;

a coupler for receiving the first and second light pulses and tapping replicas of the pair of light pulses from the loop;

an auto-correlation module, coupled to the coupler, for correlating the replica of the pair of light pulses with each other to produce a set of data points comprising a plurality of multiplied correlated pair of light pulses; and a transform module, coupled to the auto-correlation module, for transforming the data points into a channelized frequency spectrum.

2. The apparatus of claim 1 further comprising:

a first switch for generating the first and second light pulse from the first and second modulated light coupled to an input port of the coupler of the fiber optical loop;

an amplifier, coupled to the loop, for amplifying the remaining loop pulse pair in the fiber optical loop;

a first path and a second path amplifiers coupled to the first splitter in the first path and the second path, correspondingly, to modify the predetermined time delay.

3. The apparatus of claim 1 further comprising:

a first and second photo-detectors, coupled to an output port of the coupler, for generating a first and second RF signals from the replicated pulse pair;

a filter coupled to the auto-correlation module for filtering a base-band product of the correlated pair of light pulses; and wherein the transform module is a Fast-Fourier Transform (FFT) module for performing an FFT on the plurality of correlated pair of pulses, generating a channelized frequency spectrum.

4. The apparatus of claim 2 further comprising:

a first and second isolators, coupled before and after the amplifier, for preventing reflection of the loop pulse in the loop; and wherein a first and second lights, generated by a first and second light sources, modulated by a radio frequency signal by a modulator generate the first and second light pulses.

5. The apparatus of claim 3 wherein the auto-correlation module comprises:

a combiner for adding the amplified first and second RF signals; and a detector for multiplying the first and the second RF signals.

6. The apparatus of claim 5 further comprising:

an analog to digital converter (ADC), coupled to the filter, for converting the base-hand product of the correlated pair of light pulses to digital points for the FFT module.

7. The apparatus of claim 2 further comprising:

a combiner for combing the first and second light pulses after being split by the splitter into the first and second paths;

a phase shifter for shifting the phase of the combined first and second light pulses;

a second switch for filtering noise from the combined first and second light pulses; and a polarizer for reducing polarization effects in the fiber optical loop.

8. The apparatus of claim 2 wherein the first and second switches are high contrast gate switches and are synchronized with each other.

9. The apparatus of claim 2 wherein the output of the first switch is coupled to a plurality of cascaded fiber optical loops for processing continuous wave signals.

10. The apparatus of claim 6 wherein the first and second switches, the analog to digital converter and the FFT module are controlled by a computer.

11. The apparatus of method 4 further comprising:

a combiner coupled to the first and second light sources for combining the first and second lights into a multiplexed light signal;

a first polarizer, coupled to the combiner, for matching the polarization effects in the modulator; and a second polarizer, coupled to the modulator, for controlling the polarization effects in the multiplexed light signal in the coupler and optical loop.

12. The apparatus of claim 11 wherein the combiner is a multiplex.

13. The apparatus of claim 12 wherein the multiplexer is a wavelength division multiplex.

14. The apparatus of claim 11 wherein the first polarizer is a fiber polarizer.

15. The apparatus of claim 4 wherein the modulator is a Mach Zehnder optical modulator.

16. The apparatus of claim 1 wherein the coupler has a coupling ratio range from 50%:50% to 1%:99%.

17. The apparatus of claim 1 wherein a length of the fiber optical loop length is greater than a pulse width in real space.

18. The apparatus of claim 1 wherein the fiber optical loop is dispersion shifted fiber with non-dispersion around the operating wavelength.

19. The apparatus of claim 2 wherein the amplifier is an Erbium doped fiber amplifier (EDFA).

20. A method for determining a channelized frequency spectrum from an RF signal comprising:

conducting, in a fiber optical loop, a first and second lights generated by the first and second light sources;

modulating, using a modulator, the first and second lights by a radio frequency signal to create a first and second pulses with corresponding first and second wavelengths;

splitting, using a first splitter, the first and second pulses in the optical loop into a first and second path based on wavelength of the first and second pulses for a small portion of the loop to introduce a predetermined time delay between the first and second pulses;

tapping, using a coupler, a replica of the pair of pulses from the loop;

correlating, using an auto-correlation module, coupled to the coupler, the replica of the pair of pulses with each other; and performing a Fast-Fourier Transform (FFT), using an FFT module, on a plurality of the correlated pair of pulses, generating a channelized frequency spectrum.

* * * * *